United States Patent
Nakamura et al.

(10) Patent No.: US 9,293,419 B2
(45) Date of Patent: Mar. 22, 2016

(54) SEMICONDUCTOR PACKAGE AND SEMICONDUCTOR DEVICE

(71) Applicant: Panasonic Intellectual Property Management Co., Ltd., Osaka (JP)

(72) Inventors: Maki Nakamura, Osaka (JP); Suguru Fujita, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/680,039

(22) Filed: Apr. 6, 2015

(65) Prior Publication Data

US 2015/0303146 A1 Oct. 22, 2015

(30) Foreign Application Priority Data

Apr. 17, 2014 (JP) .................................. 2014-085811
Jan. 28, 2015 (JP) .................................. 2015-013836

(51) Int. Cl.

| H01L 23/58 | (2006.01) |
|---|---|
| H01L 23/538 | (2006.01) |
| H01L 25/065 | (2006.01) |
| H01L 23/00 | (2006.01) |
| H01L 23/13 | (2006.01) |
| H01L 23/498 | (2006.01) |

(52) U.S. Cl.
CPC ............ *H01L 23/5384* (2013.01); *H01L 23/13* (2013.01); *H01L 23/49811* (2013.01); *H01L 24/04* (2013.01); *H01L 25/0657* (2013.01); *H01L 2924/15333* (2013.01)

(58) Field of Classification Search
CPC . H01L 25/043; H01L 25/065; H01L 25/0657; H01L 25/117; H01L 2924/15313; H01L 2924/15323; H01L 2924/15333; H01L 23/49811; H01L 23/49827; H01L 23/5384; H01L 24/04
USPC .......... 257/686, 777, E21.503, E21.511, 693, 257/737, 773, E23.069, E25.006; 438/109
See application file for complete search history.

(56) References Cited

U.S. PATENT DOCUMENTS

| 6,617,695 | B1 * | 9/2003 | Kasatani ........................ 257/778 |
| 2005/0017345 | A1 * | 1/2005 | Sathe ............................ 257/700 |
| 2007/0018333 | A1 * | 1/2007 | Tsai et al. ..................... 257/777 |
| 2009/0001606 | A1 | 1/2009 | Tamadate | |
| 2009/0261465 | A1 | 10/2009 | Shinagawa | |

FOREIGN PATENT DOCUMENTS

| JP | 2009-010073 | 1/2009 |
| JP | 2009-278064 | 11/2009 |

* cited by examiner

*Primary Examiner* — Jasmine Clark
(74) *Attorney, Agent, or Firm* — Greenblum & Bernstein, P.L.C.

(57) ABSTRACT

A semiconductor package includes a first substrate including a first surface layer where a first pad region and a second pad region are formed, the first pad region including a plurality of first pads for connection to a first IC, the second pad region including a plurality of second pads for connection to a second substrate, and a second surface layer where a third pad region including a plurality of third pads for connection to a second IC is formed, the second surface layer being formed on an opposite side of the first surface layer. The second pads surround the first pad region in at least three rows, and one or more pads included in the second pads and arranged in an inner portion are connected to one or more pads included in the first pads and to one or more pads included in the third pads.

6 Claims, 6 Drawing Sheets

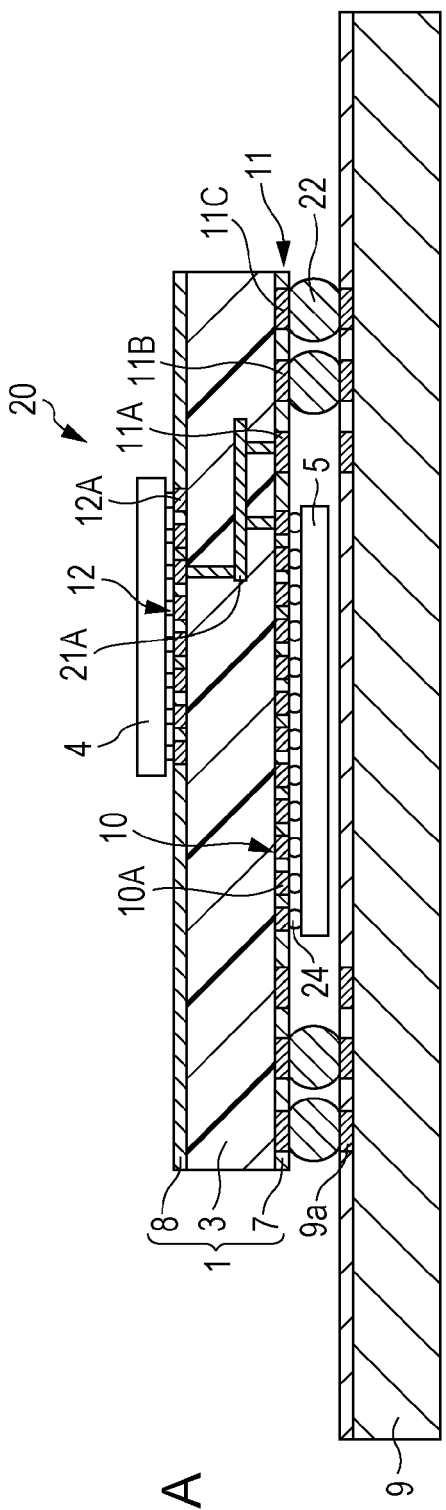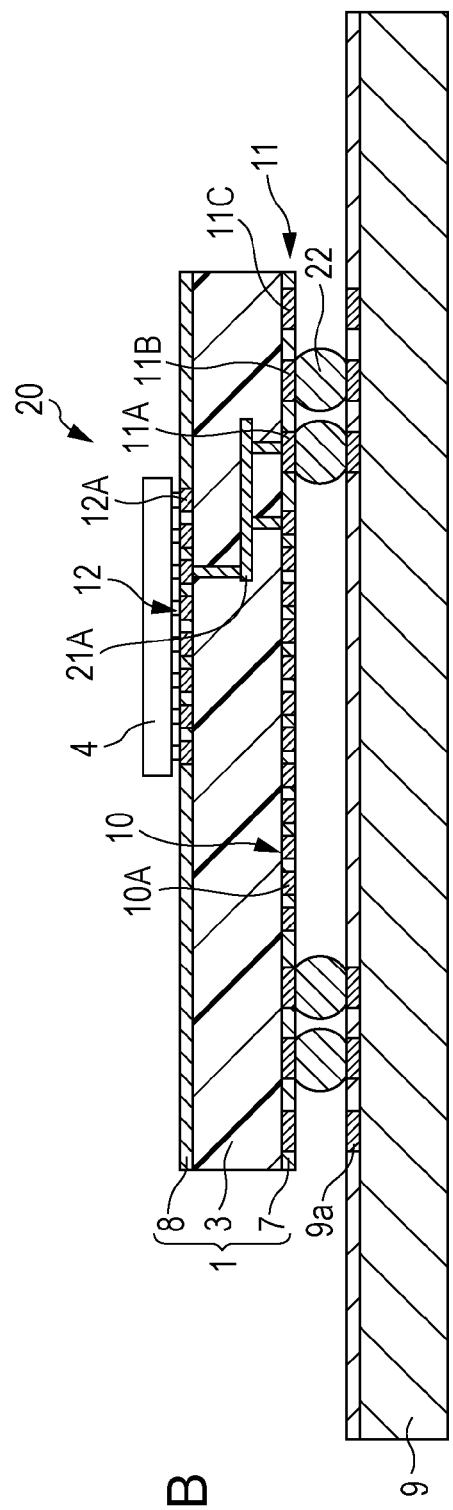

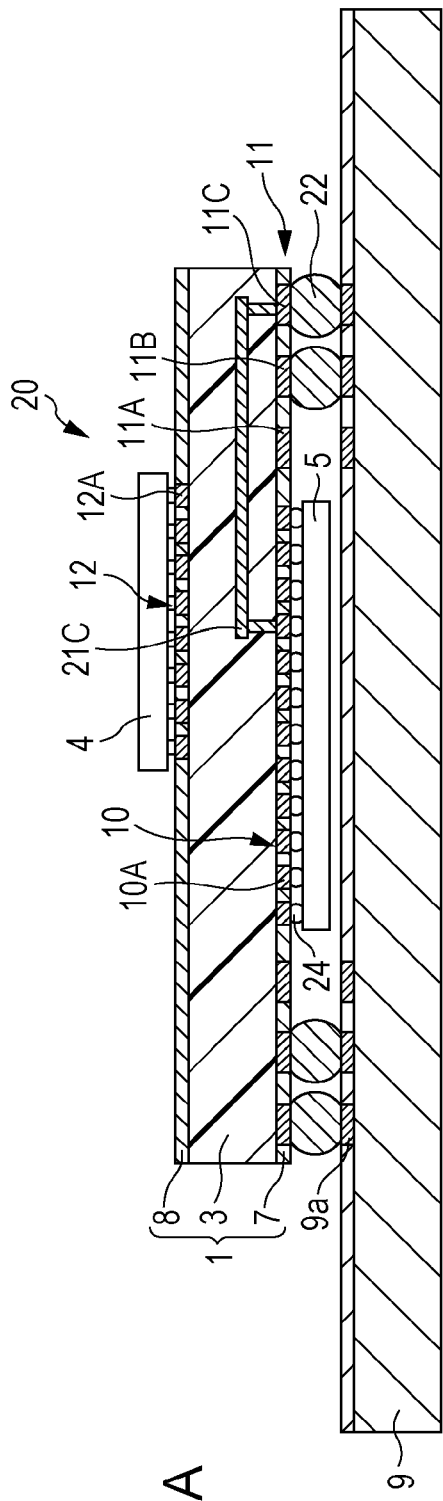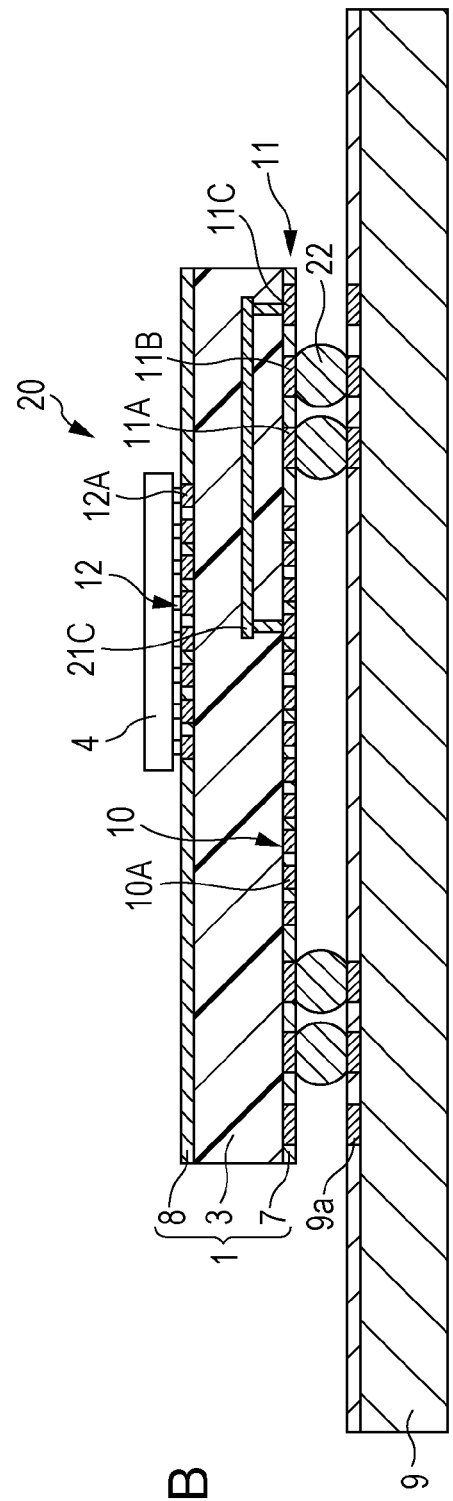

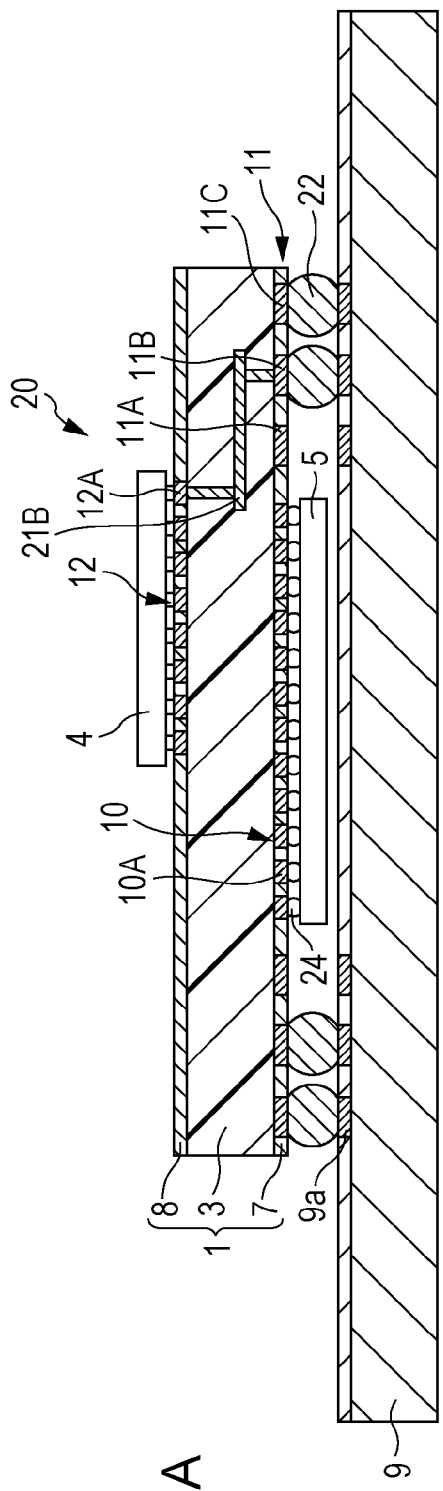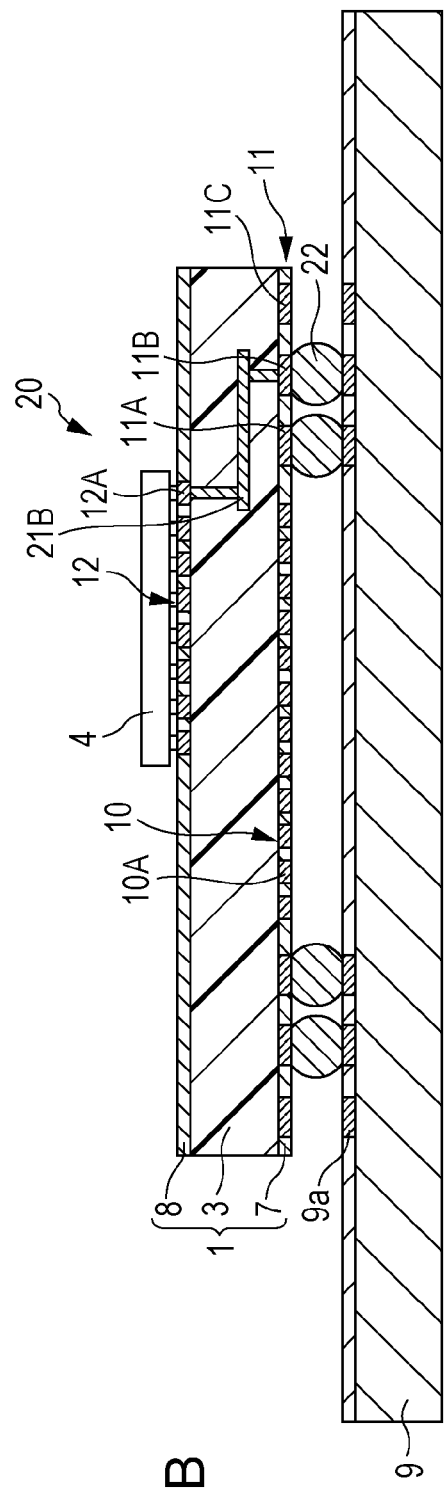

SEMICONDUCTOR PACKAGE AND SEMICONDUCTOR DEVICE

BACKGROUND

1. Technical Field

The present disclosure relates to a semiconductor package and a semiconductor device.

2. Description of the Related Art

Demands for greater density and downsizing of semiconductor packages used in smartphones, digital cameras, or the like have grown in recent years. In addition, functions needed by customers have been diversifying and while some semiconductor packages each incorporate semiconductor packages ready for various demands, such as a plurality of integrated circuits (ICs), some semiconductor packages are each tailored for one specific function.

Examples of a semiconductor package known as a conventional semiconductor package include a semiconductor package where a land pad is protected from the filling of an underfill resin by arranging a protecting member so that the protecting member surrounds the land pad arranged in an outer portion of the semiconductor package (see, for example, Japanese Unexamined Patent Application Publication No. 2009-10073).

A semiconductor package with a laminated structure is also known, where semiconductor packages stacked vertically while sandwiching a tape substrate (see, for example, Japanese Unexamined Patent Application Publication No. 2009-278064).

SUMMARY

In a conventional semiconductor package, it has been difficult to share a substrate without depending on the number of ICs mounted in the semiconductor package and reduce the cost.

One non-limiting and exemplary embodiment provides a semiconductor package that enables a substrate to be shared without depending on the number of mounted ICs and may reduce the cost.

In one general aspect, the techniques disclosed here feature a semiconductor package that includes a first substrate including a first surface layer where a first pad region and a second pad region are formed, the first pad region including a plurality of first pads for connection to a first IC, the second pad region including a plurality of second pads for connection to a second substrate, and a second surface layer where a third pad region including a plurality of third pads for connection to a second IC is formed, the second surface layer being formed on an opposite side of the first surface layer, where the plurality of second pads surround the first pad region in at least three rows, and one or more pads included in the plurality of second pads and arranged in an inner portion are connected to one or more pads included in the plurality of first pads and to one or more pads included in the plurality of third pads.

According to the present disclosure, a substrate may be shared in a plurality of mounting forms and the cost may be reduced.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3A is a cross-sectional view illustrating a connection example of the pads arranged in an innermost row in the second pad region in a semiconductor device according to the embodiment, where a BBIC is mounted;

FIG. 3B is a cross-sectional view illustrating a connection example of the pads arranged in the innermost row in the second pad region in the semiconductor device according to the embodiment, where the BBIC is not mounted;

FIG. 4A is a cross-sectional view illustrating a connection example of the pads arranged in an outermost row in the second pad region in the semiconductor device according to the embodiment, where the BBIC is mounted;

FIG. 4B is a cross-sectional view illustrating a connection example of the pads arranged in the outermost row in the second pad region in the semiconductor device according to the embodiment, where the BBIC is not mounted;

FIG. 5A is a cross-sectional view illustrating a connection example of the pads arranged in a middle row in the second pad region in the semiconductor device according to the embodiment, where the BBIC is mounted;

FIG. 5B is a cross-sectional view illustrating a connection example of the pads arranged in the middle row in the second pad region in the semiconductor device according to the embodiment, where the BBIC is not mounted.

DETAILED DESCRIPTION

Figure 1A:
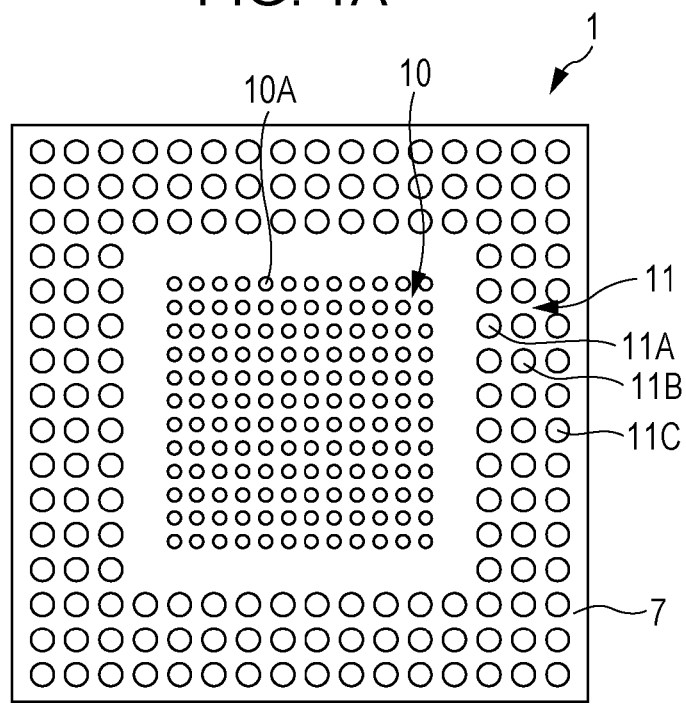
FIG. 1A is a plan view illustrating a first surface layer as an arrangement example of a semiconductor package according to an embodiment.

An embodiment of the present disclosure is described below with reference to the drawings.

Underlying Knowledge Forming Basis of the Embodiment of the Present Disclosure A conventional semiconductor package needs high cost related to, for example, design and management because all semiconductor packages that satisfy various demands from customers are prepared individually.

As an example, a case is described in which an external substrate and ball grid array (BGA) are used for connection of a semiconductor package where a radio frequency integrated circuit (RFIC) that performs radio communication in a high-frequency band, such as a millimeter wave band, is mounted. As regards the conventional semiconductor package, depending on a customer's demand, a baseband integrated circuit (BBIC) for baseband processing is mounted in a pad region of the semiconductor package that faces the external substrate or no BBIC is mounted in the semiconductor package because an external BBIC is used.

The semiconductor package according to Japanese Unexamined Patent Application Publication No. 2009-10073 is not a semiconductor package that allows a plurality of ICs to be mounted but is a semiconductor package for one IC. Thus, when a plurality of ICs are mounted in the semiconductor package according to Japanese Unexamined Patent Application Publication No. 2009-10073, the number of kinds of the semiconductor package is large so as to suit the number of ICs and the cost is increased.

Although a plurality of ICs may be mounted in the semiconductor package according to Japanese Unexamined Patent Application Publication No. 2009-278064 by stacking semiconductor packages into two stages, the number of kinds of the semiconductor packages is not reduced and the cost is high. Besides, since mounting of a wireless module is not taken into account in the semiconductor package according to Japanese Unexamined Patent Application Publication No. 2009-278064, when a wireless module is mounted, antenna characteristics are decreased by stacking semiconductor packages into a plurality of stages.

The embodiment below describes a semiconductor package and a semiconductor device, which enable a substrate to be shared without depending on the number of ICs that are mounted and may reduce the cost.

For example, a semiconductor package where an RFIC is mounted is used to describe the semiconductor package according to the embodiment below. The semiconductor package includes a substrate and a pad formed on the substrate, which is an electrode pad. The RFIC is an example of a second IC and is one of wireless modules for performing processes related to the radio communication in a high-frequency band, such as a millimeter wave band. In the semiconductor package, a BBIC is mounted or no BBIC is mounted. The BBIC is an example of a first IC and is one of wireless modules for performing processes related to the radio communication in a baseband.

For example, the semiconductor device according to the below-described embodiment includes the semiconductor package and the RFIC, which are described above, and a conductive member, such as a solder ball. The semiconductor device includes the BBIC or does not include the BBIC.

First Embodiment

Figure 1B:
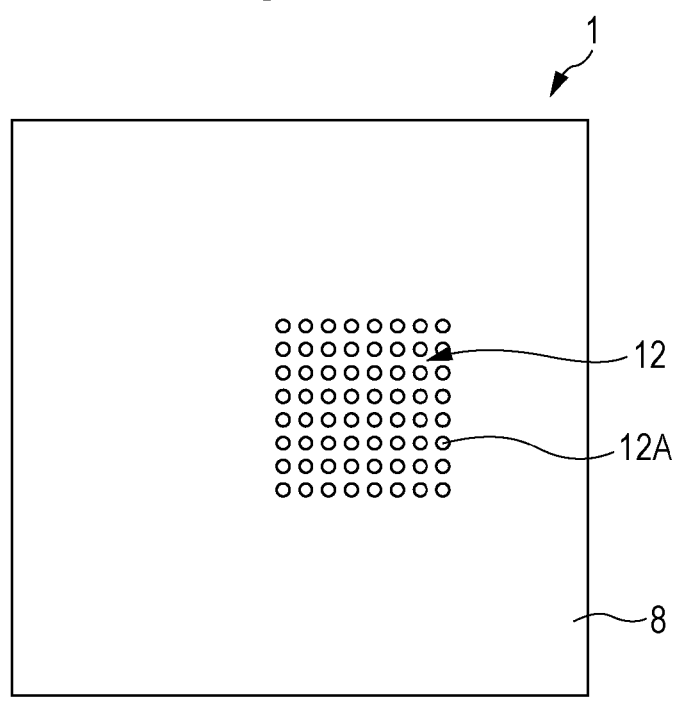
FIG. 1B is a plan view illustrating a second surface layer as an arrangement example of the semiconductor package according to the embodiment.

FIG. 1A is a plan view illustrating a first surface layer 7 as an arrangement example of a semiconductor package 1 according to a first embodiment. FIG. 1B is a plan view illustrating a second surface layer 8 as an arrangement example of the semiconductor package 1 according to the first embodiment. The semiconductor package 1 includes a substrate 3, which is for example, a resin substrate with both surfaces on which the first surface layer 7 and the second surface layer 8 are formed, respectively. FIG. 1A depicts the first surface layer 7 of the substrate 3 on the side facing an external substrate 9 (see FIG. 3A). FIG. 1B depicts the second surface layer 8 of the substrate 3 on the side opposite the first surface layer 7, where an RFIC 4 is mounted (see FIG. 3A). The substrate 3 is an example of a first substrate and the external substrate 9 is an example of a second substrate.

For example, since wavelengths are short in a high-frequency band, such as a millimeter wave band of 60 GHz, the second surface layer 8 of the semiconductor package 1 is provided with an antenna and is integrated with the RFIC 4. Accordingly, the semiconductor package 1 may reduce transmission loss of a signal transmitted to or from the antenna.

The first surface layer 7 includes a first pad region 10 for flip-chip connection, which is an example of IC connection, and a second pad region 11 for connection to the external substrate. The first pad region 10 is a region where a BBIC 5 for baseband processing is mounted, and is for example, a rectangular region. The first pad region 10 includes a plurality of pads 10A arranged like lattice points for example.

The second pad region 11 is a region that surrounds the first pad region 10 at a certain distance from the first pad region 10, and is a region like a frame for example. The second pad region 11 includes a pad formed along the outer periphery of the semiconductor package 1 like a frame. The pad includes three rows of pads 11A, 11B, and 11C, which surround the first pad region 10. For example, the three rows of pads 11A, 11B, and 11C are spaced evenly.

The pads 11A are arranged in the innermost row in the second pad region 11. The pads 11C are arranged in the outermost row in the second pad region 11. The pads 11B are arranged in the middle row between the pads 11A and the pads 11C.

Although it is herein described as an example that three rows of pads are arranged in the second pad region 11 to surround the first pad region 10, four or more rows of pads may be arranged.

The second surface layer 8 includes a third pad region 12 for flip-chip connection. The third pad region 12 includes a plurality of pads 12A arranged like lattice points for example.

Figure 2A:
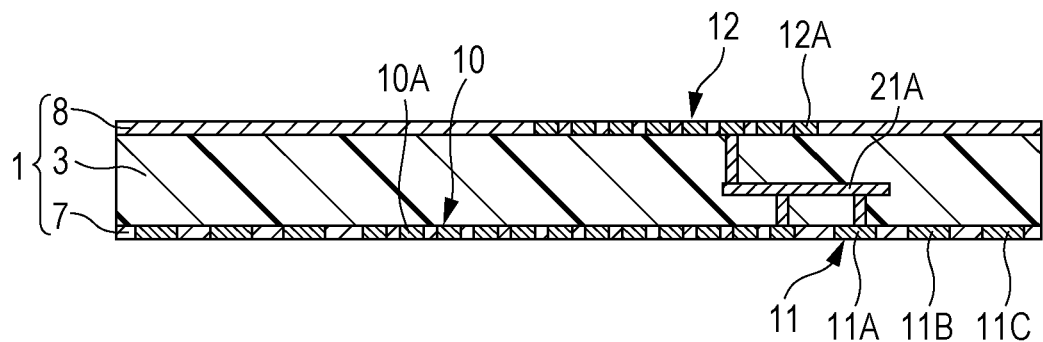
FIG. 2A is a cross-sectional view illustrating a wiring connection example for pads in a second pad region according to the embodiment.

FIG. 2A is a cross-sectional view illustrating a wiring connection example for the pads 11A in the second pad region 11. The pads 11A are connected to the pads 10A arranged in the first pad region 10 and the pads 12A arranged in the third pad region 12 through a line 21A. FIG. 2A illustrates connection at three locations. For example, the line 21A is formed in an internal layer of the substrate 3.

As described below, the pads 11A are used to connect the RFIC 4 and an external BBIC and transmit a baseband signal or a control signal between the RFIC 4 and the external BBIC. As the baseband signal, for example, an in-phase quadrature (IQ) signal is transmitted. Since the number of signal lines for the baseband signal or the control signal is small, compared to a signal of an external interface or a control signal of the BBIC described below, the number of pads of the pads 11A may be small. Thus, the pads 11A may be arranged in the innermost row where it is difficult to increase the number of pads.

Figure 2B:
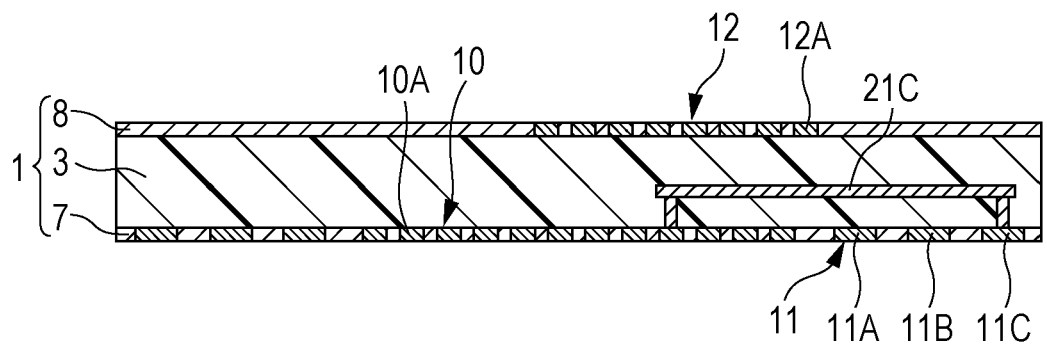
FIG. 2B is a cross-sectional view illustrating a wiring connection example for another pads in the second pad region according to the embodiment.

FIG. 2B is a cross-sectional view illustrating a wiring connection example for the pads 11C in the second pad region 11. The pads 11C are connected to the pads 10A arranged in the first pad region 10 through a line 21C. The pads 11C are connected to the BBIC 5 mounted in the first pad region 10 and are used to transmit a signal of the external interface or a control signal of the BBIC between the inside and the outside of the semiconductor package 1. For example, the line 21C is formed in the internal layer of the substrate 3.

Figure 2C:
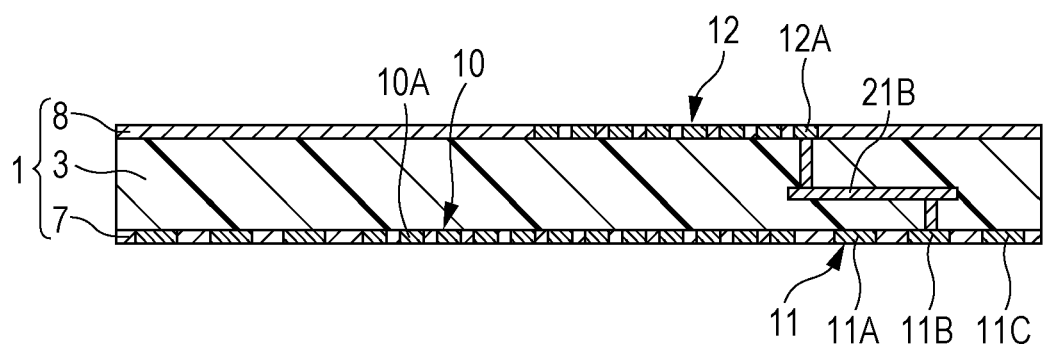
FIG. 2C is a cross-sectional view illustrating a wiring connection example for another pads in the second pad region according to the embodiment.

FIG. 2C is a cross-sectional view illustrating a wiring connection example for the pads 11B in the second pad region 11. The pads 11B are connected to the pads 12A arranged in the third pad region 12 through a line 21B. For example, the pads 11B are used to supply power to the RFIC 4 or transmit a control signal of the RFIC 4 between the inside and the outside of the semiconductor package 1. For example, the line 21B is formed in the internal layer of the substrate 3.

A semiconductor device 20 that uses the semiconductor package 1 is described below.

For example, the semiconductor device 20 includes the semiconductor package 1, the RFIC 4 mounted in the third pad region 12, and a solder ball 22. In the semiconductor device 20, the BBIC 5 may be mounted or omitted in the first pad region 10. The semiconductor device 20 may include or omit the external substrate 9. The semiconductor device 20 is connected to the external substrate 9 by BGA in the second pad region 11. The solder ball 22 is an example of a conductive member.

FIG. 3A is a cross-sectional view illustrating a connection example of the pads 11A arranged in the innermost row in the second pad region 11 in the semiconductor device 20, where the BBIC 5 is mounted in the first pad region 10 of the first surface layer 7. Since the BBIC 5 performs various digital signal processes, which include a coding process, a decoding process, a transmission-related process, and a reception-related process, for example, a large number of pads are provided.

In FIG. 3A, the solder balls 22 are not present between pads 9a arranged on the external substrate 9 and the pads 11A arranged in the second pad region 11. That is, no signals are transmitted between the RFIC 4 and the BBIC 5, and the external substrate 9, which are included in the semiconductor device 20. Thus, the semiconductor device 20 may perform signal transmission while suppressing decrease in transmission characteristics between the RFIC 4 and the BBIC 5 for example.

FIG. 3B is a cross-sectional view illustrating an arrangement example of the semiconductor device 20 where the BBIC 5 is not mounted in the first pad region 10 of the first surface layer 7. In FIG. 3B, the pads 9a arranged on the external substrate 9 and the pads 11A arranged in the second pad region 11 are connected to each other through the solder balls 22. Accordingly, the semiconductor package 1 is connected to the external substrate 9.

The size of the solder ball 22 is decided in view of the BBIC 5 being mounted and has a value larger than a total value of the thickness (height) of the BBIC 5 and the height of a bump 24 for connecting the BBIC 5 to the semiconductor package 1.

For example, when the thickness of the BBIC 5 is 150 µm and the height of the bump 24 is 80 µm, the size (diameter) of the solder ball 22 is larger than a total value of 230 µm and is for example, 400 µm.

The size of the solder ball 22 decides the sizes of the pads 11A to 11C arranged in the second pad region 11 and the size of an opening of a resist applied onto the pads 11A to 11C. For example, when the solder ball 22 of 400 µm is used, the size of the opening of the resist is for example, 300 µm and the size of each of the pads 11A to 11C is for example, 400 µm.

As illustrated in FIG. 3A, when the BBIC 5 is mounted in the first pad region 10, a terminal of the RFIC 4 mounted in the third pad region 12 is connected to a terminal of the BBIC 5 through the line 21A. The solder balls 22 are not arranged between the pads 11A arranged in the second pad region 11 and the external substrate 9. That is, for example, it may be suppressed in the semiconductor package 1 that the solder balls 22 and the BBIC 5 close to each other come into contact and electricity flows by not arranging the solder balls 22 between the pads 11A and the external substrate 9. As regards the semiconductor package 1, the pads 11C in the outermost row and the solder balls 22 are connected to each other.

When the BBIC 5 is not mounted in the first pad region 10 as illustrated in FIG. 3B, the terminal of the RFIC 4 mounted in the third pad region 12 is connected to the pads 11A arranged in the second pad region 11 through the line 21A. The solder balls 22 are not arranged between the pads 11C arranged in the second pad region 11 and the external substrate 9. The terminal of the RFIC 4 is connected to, for example, the external BBIC through the solder balls 22 arranged between the pads 11A and the external substrate 9. That is, it is adaptable to the presence or absence of the BBIC 5 by causing the single second pad region 11 to have three rows in the semiconductor package 1.

FIG. 4A is a cross-sectional view illustrating a connection example of the pads 11C arranged in the outermost row in the second pad region 11 in the semiconductor device 20 where the BBIC 5 is mounted in the first pad region 10 of the first surface layer 7. FIG. 4B is a cross-sectional view illustrating a connection example of the pads 11C arranged in the outermost row in the second pad region 11 in the semiconductor device 20 where the BBIC 5 is not mounted in the first pad region 10 of the first surface layer 7.

In FIG. 4A, a terminal of the BBIC 5 mounted in the first pad region 10 is connected to the pads 11C in the outermost row in the second pad region 11 through the line 21C and to the external substrate 9 through the pads 11C. That is, the solder balls 22 are not arranged between the pads 11A in the innermost row in the second pad region 11 and the external substrate 9. Thus, the semiconductor package 1 may transmit a signal after baseband processing to the external substrate 9. Further, the semiconductor package 1 may receive a signal from the external substrate 9 and perform baseband processing on the received signal.

In FIG. 4B, since the BBIC 5 is not mounted in the first pad region 10, the pads 11C in the outermost row in the second pad region 11 are not used.

FIG. 5A illustrates a connection example of the pads 11B arranged in the middle row in the second pad region 11 in the semiconductor device 20 where the BBIC 5 is mounted in the first pad region 10 of the first surface layer 7. FIG. 5B illustrates a connection example of the pads 11B arranged in the middle row in the second pad region 11 in the semiconductor device 20 where the BBIC 5 is not mounted in the first pad region 10 of the first surface layer 7.

A terminal of the RFIC 4 mounted in the third pad region 12 is connected to the pads 11B arranged in the middle row in the second pad region 11 through the line 21B and is connected to the external substrate 9 through the pads 11B. Accordingly, the semiconductor package 1 may transmit a radio frequency (RF) signal to the external substrate 9. Further, the semiconductor package 1 may receive a signal from the external substrate 9 and perform RF processing on the received signal.

Described below is an example of the pads included in the pads 11A, 11B, and 11C arranged in the second pad region 11 in the semiconductor device 20, where the solder balls 22 are mounted.

When the semiconductor package 1 is used to manufacture the semiconductor device 20, the RFIC 4 is mounted over the substrate 3 first. After that, when for example, the semiconductor device 20 with the BBIC 5 mounted for baseband processing is demanded from a customer, the solder balls 22 are mounted on the pads 11B and 11C in the second pad region 11 (see, for example, FIGS. 3A, 4A, and 5A). When for example, the semiconductor device 20 without the BBIC 5 mounted for baseband processing is demanded from the customer, the solder balls 22 are mounted on the pads 11A and 11B in the second pad region 11 (see, for example, FIGS. 3B, 4B, and 5B).

That is, the semiconductor package 1 is adaptable both when manufacturing the semiconductor device 20 where both the RFIC 4 and the BBIC 5 are mounted and when manufacturing the semiconductor device 20 where the RFIC 4 is mounted and the BBIC 5 is not mounted.

As described above, the semiconductor package 1 is adaptable to both the semiconductor device 20 where a plurality of ICs are mounted and the semiconductor device 20 where one IC is mounted. That is, the semiconductor package 1 enables a substrate to be shared without depending on the number of ICs that are mounted. Accordingly, the cost related to the design and management of the semiconductor package 1 and the semiconductor device 20 may be reduced. As a result, the semiconductor package 1 with high versatility may be offered.

In the semiconductor package 1, the plurality of pads 11A, 11B, and 11C that surround the first pad region 10 in at least three rows are arranged in the second pad region 11. For example, the semiconductor package 1 allows connection among three locations, which are the pads 11A arranged in the innermost row in the second pad region 11, the pads 10A arranged in the first pad region 10, and the pads 12A arranged in the third pad region 12.

Thus, in the semiconductor package 1 where the BBIC 5 is mounted, the RFIC 4 and the BBIC 5 may be connected and a signal may be transmitted between the RFIC 4 and the BBIC 5. The semiconductor package 1 where the BBIC 5 is not mounted is connected to for example, the external BBIC mounted on the external substrate 9 through the RFIC 4 and the pads 11A, and a signal may be transmitted between the semiconductor package 1 and the external substrate 9.

In the semiconductor package 1 where the BBIC 5 is mounted in the first pad region 10, the solder balls 22 are not connected to the pads 11A in the innermost row in the second pad region 11 and thus, a certain distance may be secured between the BBIC 5 and the solder balls 22.

In the semiconductor package 1 where the BBIC 5 is not mounted in the first pad region 10, the solder balls 22 are connected to the pads 11A in the innermost row in the second pad region 11. Since the BBIC 5 is not mounted in the semiconductor package 1, the pads 11A in the innermost row may be positioned on the more inner side, which is closer to the first pad region 10, and downsizing may be achieved.

In addition, in the semiconductor package 1, the pads 12A arranged in the third pad region 12 and the pads 10A arranged in the first pad region 10 are connected. Accordingly, a signal may be transmitted from the RFIC 4 mounted in the third pad region 12 to the BBIC 5 mounted in the first pad region 10 and thus, for example, the semiconductor device 20 may perform baseband processing on a signal received at the antenna included in the RFIC 4 in the semiconductor device 20.

Further, the pads 11C arranged in the outermost row in the second pad region 11 are connected to the pads 10A arranged in the first pad region 10. Accordingly, when the BBIC 5 is mounted in the first pad region 10, the pads 11C arranged in the outermost row are connected to the terminal of the BBIC 5 and thus, the semiconductor package 1 may secure the larger number of pads for connection between the BBIC 5 and the external substrate 9. Thus, the semiconductor package 1 is adaptable to more functions of the BBIC 5 and the external interface.

The pads 11B arranged in the middle row in the second pad region 11 are connected to the pads 12A arranged in the third pad region 12. Accordingly, even though the solder balls 22 are not connected to the pads 11A arranged in the innermost row in the second pad region 11 or to the pads 11C arranged in the outermost row, the pads 11B arranged in the middle row in the second pad region 11 are connected to the solder balls 22. In the present embodiment, the solder balls 22 are mounted on the pads 11A or 11C arranged in the innermost or outermost row of the three rows in the second pad region 11 in the semiconductor package 1, which is connected to the external substrate 9, and are further mounted on the pads 11B in the middle row. Thus, the joint strength between the substrate 3 and the external substrate 9 may be enhanced in the semiconductor device 20.

For example, the semiconductor device 20 may include the semiconductor package 1, the RFIC 4, which is the IC mounted in the third pad region 12, the BBIC 5, which is the IC mounted in the first pad region 10, the external substrate 9, and the solder balls 22 that connect the pads 11B and 11C arranged in the middle and outermost rows in the second pad region 11, respectively, to the external substrate 9.

Thus, the semiconductor device 20 may use the semiconductor package 1 where the ICs are mounted in both the first pad region 10 and the third pad region 12. In addition, since the IC mounted in the first pad region 10 and the IC mounted in the third pad region 12 are connected and thus, the semiconductor package 1 allows a baseband signal or a control signal to be transmitted between the RFIC 4 and the BBIC 5 and processes from radio signal processing to baseband signal processing may be performed in the semiconductor package 1. In the semiconductor device 20, an IC and the solder balls 22 are desired to be positioned at a distance having a certain length or more so as not to be connected when undesired in being mounted. Since the semiconductor device 20 enables space to be made between the pads 11A arranged in the innermost row in the second pad region 11 and the external substrate 9, a distance between the IC mounted in the first pad region 10 and the solder balls 22 may be secured. Thus, in the semiconductor device 20, the pads 11A arranged in the innermost row in the second pad region 11 may be positioned on the more inner side and downsizing may be achieved.

For example, the semiconductor device 20 may include the semiconductor package 1, the RFIC 4, which is the IC mounted in the third pad region 12, the external substrate 9, and the solder balls 22 that connect the pads 11A and 11B arranged in the innermost and middle rows in the second pad region 11, respectively, to the external substrate 9.

Thus, the semiconductor device 20 may use the semiconductor package 1 where the IC is mounted in the third pad region 12. When the IC is not mounted in the first pad region 10, the pads 11C arranged in the outermost row in the second pad region 11 are not connected to the external substrate 9. Since the pads 9a arranged on the external substrate 9, which face the pads 11C, may be omitted in the semiconductor device 20 accordingly, a wiring region of the external substrate 9 may be increased and the external substrate 9 may be downsized. The semiconductor package 1 may employ different resist patterns so that when the BBIC 5 as the first IC is connected to the first pad region 10, the pads 11A arranged in the innermost row in the second pad region 11, which are electrode pads, are covered with a resist and when the BBIC 5 is not connected to the first pad region 10, the pads 11C arranged in the outermost row in the second pad region 11, which are electrode pads, are covered with a resist.

Variation

When a BBIC is mounted in a semiconductor device, the size of a solder ball is typically desired to be larger than the height of the BBIC, which is a total value of the thickness (height) of the BBIC and the height of a bump of the BBIC. Accordingly, the clearance among pads, which is referred to as the pad clearance, in a pad region for connection to an external substrate depends on the size of the solder ball and it is often difficult to make the pad clearance sufficiently small. When the pad clearance is large, the number of pads is decreased and in some cases, the function of the BBIC and the kind of the cooperating external interface are limited.

Figure 6:
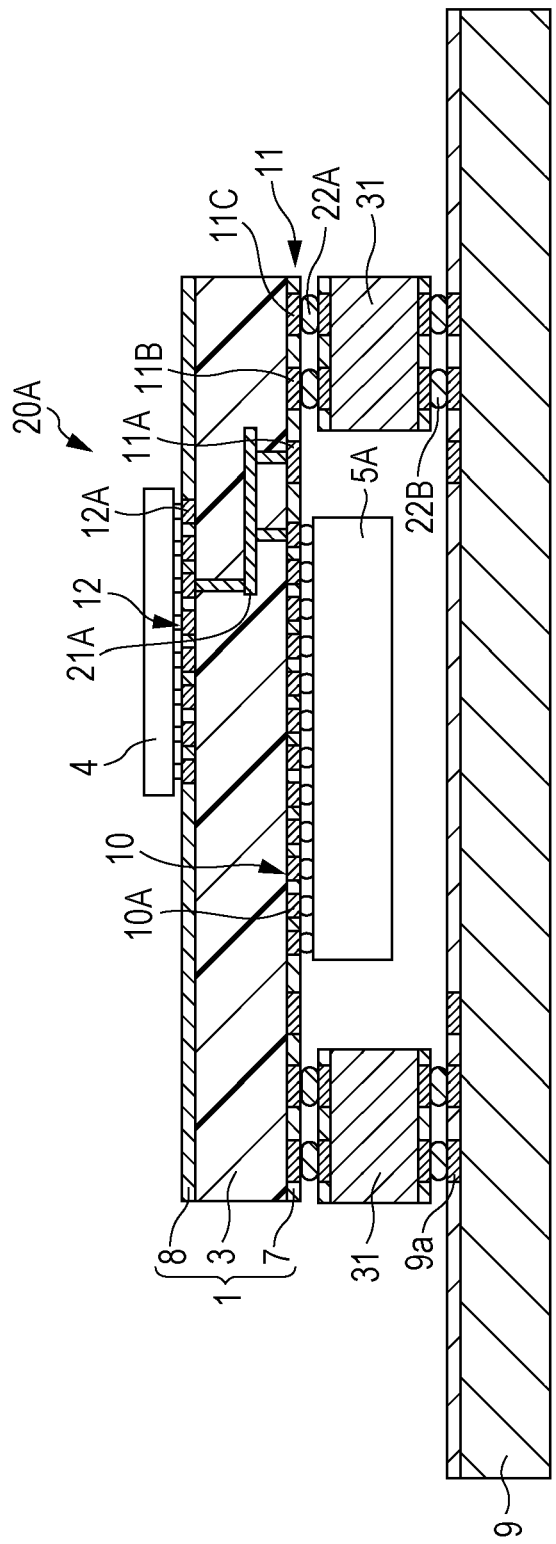
FIG. 6 is a cross-sectional view illustrating an arrangement example of a semiconductor device according to a variation of the embodiment, which includes a cavity substrate.

FIG. 6 illustrates an arrangement example of a semiconductor device 20A according to a variation of the embodiment. In the semiconductor device 20A, a BBIC 5A is mounted and for example, solder balls 22A and 22B that are smaller than the solder balls 22 in FIG. 3A are arranged between the semiconductor package 1 and the external substrate 9.

The semiconductor device 20A includes the semiconductor package 1, the RFIC 4, the BBIC 5, a cavity substrate 31, and the solder balls 22A and 22B. The cavity substrate 31 and the solder balls 22A and 22B are arranged between the semiconductor package 1 and the external substrate 9. The semiconductor device 20A may include the external substrate 9. The cavity substrate 31 is an example of a third substrate. The solder balls 22A connect the cavity substrate 31 and the pads 11B and 11C in the second pad region 11 of the substrate 3 in the semiconductor package 1. The solder balls 22B connect the cavity substrate 31 and the external substrate 9.

In the semiconductor device 20A, the pads 11B and 11C arranged in the second pad region 11 are connected to the external substrate 9 via the cavity substrate 31. Accordingly, even when the thickness of the BBIC 5A mounted in the second pad region 11 is large and a long distance is secured between the second pad region 11 and the external substrate 9, the solder balls 22A and 22B may be made small. Thus, the semiconductor device 20A may decrease the pad clearance in the second pad region 11 and the second pad region 11 may be formed in a small area, and the semiconductor device 20A may be downsized easily.

Further, in the semiconductor device 20A, the number of pads arranged in the second pad region 11 may be increased by making the pad clearance smaller and the BBIC 5A may be mounted on the arranged pads 11A, 11B, and 11C large in number. Since the use of the pads 11A, 11B, and 11C large in number enables a large number of signals to be transmitted, the semiconductor device 20A is adaptable to more functions. As described above, in the semiconductor device 20A, the pad clearance in the second pad region 11 may be decided while reducing dependence on the height of the BBIC 5A because of the use of the cavity substrate 31.

Although the embodiment and the variation thereof are described above with reference to the drawings, it is needless to mention that the present disclosure is not limited to these examples. A person skilled in the art may obviously arrive at variations or modifications within the scope recited in the claims, and the variations or modifications should be understood as belonging in the technical scope of the present disclosure as a matter of course.

In the semiconductor package 1, pads that surround the first pad region 10 in four or more rows may be arranged in the second pad region 11. For example, in the semiconductor package 1, the pads arranged in the consecutive rows from the outer side of the second pad region 11 may be regarded as pads in an outer portion. The pads in the outer portion may be handled as being similar to the pads in the outermost row of the three rows in the above-described embodiment. For example, the pads arranged in the consecutive rows from the inner side of the second pad region 11 may be regarded as pads in an inner portion. The pads in the inner portion may be handled as being similar to the pads in the innermost row of the three rows in the above-described embodiment. For example, the pads arranged between the outer portion and the inner portion in the second pad region 11 may be regarded as pads in a middle portion. The pads in the middle portion may be handled as being similar to the pads in the middle row of the three rows in the above-described embodiment.

For example, in the semiconductor package 1 where the BBIC 5 for baseband processing is not mounted, the size of the solder ball 22 may be made smaller. Accordingly, the semiconductor devices 20 and 20A may be reduced in height.

Although the pads that are circular are described as an example, the pads may each have a shape other than a circle, such as a rectangle.

Outline of Aspects of the Present Disclosure

A first semiconductor package according to the present disclosure includes a first substrate including a first surface layer where a first pad region and a second pad region are formed, the first pad region including a plurality of first pads for connection to a first IC, the second pad region including a plurality of second pads for connection to a second substrate, and a second surface layer where a third pad region including a plurality of third pads for connection to a second IC is formed, the second surface layer being formed on an opposite side of the first surface layer, where the plurality of second pads surround the first pad region in at least three rows, and one or more pads included in the plurality of second pads and arranged in an inner portion are connected to one or more pads included in the plurality of first pads and to one or more pads included in the plurality of third pads.

A second semiconductor package according to the present disclosure is the first semiconductor package, where one or more pads included in the plurality of second pads and arranged in an outer portion are connected to one or more pads included in the plurality of first pads.

A third semiconductor package according to the present disclosure is the first semiconductor package, where one or more pads included in the plurality of second pads and arranged in a middle portion are connected to one or more pads included in the plurality of third pads.

A first semiconductor device according to the present disclosure includes the first semiconductor package, the first IC mounted in the first pad region, the second IC mounted in the third pad region, the second substrate, and one or more conductive members that connect one or more pads arranged in a middle portion and an outer portion of the second pad region and the second substrate, where the semiconductor package includes a first substrate including a first surface layer where a first pad region and a second pad region are formed, the first pad region including a plurality of first pads for connection to a first integrated circuit (IC), the second pad region including a plurality of second pads for connection to a second substrate, and a second surface layer where a third pad region including a plurality of third pads for connection to a second IC is formed, the second surface layer being formed on an opposite side of the first surface layer, where the plurality of second pads surround the first pad region in at least three rows, and one or more pads included in the plurality of second pads and arranged in an inner portion are connected to one or more pads included in the plurality of first pads and to one or more pads included in the plurality of third pads.

A second semiconductor device according to the present disclosure is the first semiconductor device and further includes a third substrate arranged between the second pad region and the second substrate, where the conductive member includes one or more first conductive members that connect one or more pads arranged in the middle portion and the outer portion of the second pad region and the third substrate, and one or more second conductive members that connect the third substrate and the second substrate.

A third semiconductor device according to the present disclosure includes the first semiconductor package, the second IC mounted in the third pad region, the second substrate, and one or more conductive members that connect one or more pads arranged in the inner portion and a middle portion of the second pad region and the second substrate, where the semiconductor package includes a first substrate including a first surface layer where a first pad region and a second pad region are formed, the first pad region including a plurality of first pads for connection to a first integrated circuit (IC), the second pad region including a plurality of second pads for connection to a second substrate, and a second surface layer where a third pad region including a plurality of third pads for connection to a second IC is formed, the second surface layer being formed on an opposite side of the first surface layer, where the plurality of second pads surround the first pad region in at least three rows, and one or more pads included in the plurality of second pads and arranged in an inner portion are connected to one or more pads included in the plurality of first pads and to one or more pads included in the plurality of third pads.

Although the embodiment and the variation thereof are described above with reference to the drawings, it is needless to mention that the present disclosure is not limited to these examples. A person skilled in the art may obviously arrive at variations or modifications within the scope recited in the claims, and the variations or modifications should be understood as belonging in the technical scope of the present disclosure as a matter of course. Also, the constituents of the embodiment and the variation thereof described above may be combined as desired within the scope not departing from the spirit of the disclosure.

The present disclosure is useful for a semiconductor package, a semiconductor device, and the like, which enable a substrate to be shared without depending on the number of ICs that are mounted and may reduce the cost.

What is claimed is:

1. A semiconductor package comprising:
   a first substrate including
      a first surface layer where a first pad region and a second pad region are formed, the first pad region including a plurality of first pads for connection to a first integrated circuit (IC), the second pad region including a plurality of second pads for connection to a second substrate, and
      a second surface layer where a third pad region including a plurality of third pads for connection to a second IC is formed, the second surface layer being formed on an opposite side of the first surface layer, wherein
   the plurality of second pads surround the first pad region in at least three rows, and
   one or more pads included in the plurality of second pads and arranged in an inner portion of the second pad region are connected to one or more pads included in the plurality of first pads and to one or more pads included in the plurality of third pads.

2. The semiconductor package according to claim 1, wherein
   one or more pads included in the plurality of second pads and arranged in an outer portion are connected to one or more pads included in the plurality of first pads.

3. The semiconductor package according to claim 1, wherein
   one or more pads included in the plurality of second pads and arranged in a middle portion are connected to one or more pads included in the plurality of third pads.

4. A semiconductor device comprising:
   a semiconductor package;
   a first integrated circuit (IC) mounted in a first pad region;
   a second IC mounted in a third pad region;
   a second substrate; and
   one or more conductive members that connect one or more pads arranged in a middle portion and an outer portion of a second pad region and the second substrate, wherein
   the semiconductor package includes
   a first substrate including
      a first surface layer where the first pad region and the second pad region are formed, the first pad region including a plurality of first pads for connection to the first IC, the second pad region including a plurality of second pads for connection to the second substrate, and
      a second surface layer where the third pad region including a plurality of third pads for connection to the second IC is formed, the second surface layer being formed on an opposite side of the first surface layer, wherein
   the plurality of second pads surround the first pad region in at least three rows, and
   one or more pads included in the plurality of second pads and arranged in an inner portion of the second pad region are connected to one or more pads included in the plurality of first pads and to one or more pads included in the plurality of third pads.

5. The semiconductor device according to claim 4, further comprising:
   a third substrate arranged between the second pad region and the second substrate, wherein
   the one or more conductive members include
      one or more first conductive members that connect one or more pads arranged in the middle portion and the outer portion of the second pad region and the third substrate, and
      one or more second conductive members that connect the third substrate and the second substrate.

6. A semiconductor device comprising:
   a semiconductor package;
   a second integrated circuit (IC) mounted in a third pad region;
   a second substrate; and
   one or more conductive members that connect one or more pads arranged in an inner portion and a middle portion of a second pad region and the second substrate, wherein
   the semiconductor package includes
   a first substrate including
      a first surface layer where a first pad region and the second pad region are formed, the first pad region including a plurality of first pads for connection to a first IC, the second pad region including a plurality of second pads for connection to the second substrate, and
   a second surface layer where the third pad region including a plurality of third pads for connection to the second IC is formed, the second surface layer being formed on an opposite side of the first surface layer, wherein
   the plurality of second pads surround the first pad region in at least three rows, and
   one or more pads included in the plurality of second pads and arranged in the inner portion of the second pad region are connected to one or more pads included in the plurality of first pads and to one or more pads included in the plurality of third pads.

* * * * *